(12) United States Patent
Weyburne et al.

(10) Patent No.: US 6,331,260 B1
(45) Date of Patent: Dec. 18, 2001

(54) VD PROCESS AND APPARATUS FOR PRODUCING STAND-ALONE THIN FILMS

(75) Inventors: David W. Weyburne, Maynard; Brian S. Ahern, Boxboro, both of MA (US)

(73) Assignee: The United States of America as represented by the Secretary of the Air Force, Washington, DC (US)

(*) Notice: Subject to any disclaimer, the term of this patent is extended or adjusted under 35 U.S.C. 154(b) by 0 days.

(21) Appl. No.: 09/458,734

(22) Filed: Dec. 13, 1999

Related U.S. Application Data

(62) Division of application No. 09/062,734, filed on Apr. 14, 1998, now abandoned, which is a continuation-in-part of application No. 07/991,502, filed on Dec. 16, 1992, now Pat. No. 5,252,366, which is a division of application No. 07/469,128, filed on Jan. 24, 1990, now Pat. No. 5,129,360.

(51) Int. Cl.$^7$ .................................................. C23C 16/00
(52) U.S. Cl. .................... 216/72; 427/248.1; 427/255.1; 427/398.1; 427/534
(58) Field of Search .................... 216/72, 58; 427/248.1, 427/398.1, 255.1, 534; 438/694, 737, 738

(56) References Cited

U.S. PATENT DOCUMENTS 5,270,077 * 12/1993 Kenemeyer et al. ................ 427/249
5,270,294 * 12/1993 Wu et al. ................................ 427/62
5,314,652 * 5/1994 Simpson et al. ...................... 427/553

* cited by examiner

*Primary Examiner*—Thi Dang
(74) *Attorney, Agent, or Firm*—Stanton E. Collier

(57) ABSTRACT

This invention is a process and apparatus for producing single crystal, polycrystal or amorphous stand-alone films. The process has two steps: First, thin layers of the desired materials are deposited by VD onto a hot foreign single crystal substrate wafer held by a substrate platter in a pocket formed in such. The second step is to chemically etch away the substrate while still being held by the substrate platter while the film-substrate is still hot. The etch is stopped as soon as all of the foreign substrate is consumed. This leaves just the thin film which is then cooled down to room temperature. The bottom surface of this pocket has a plurality of channels for carrying an etching gas which is input by a central channel in the substrate platter. The reactants that form the stand-alone film are input through an actively cooled effusion cell having a plenum for receiving the reactant gas. The reactant gas flows past a plurality of parallel spaced-apart tubes having a coolant therein onto the heated substrate surface which is in very close proximity to the coolant tubes. The thin films can be deposited by any of the various VD methods such as plasma assisted CVD and D.C. or RF sputtering.

12 Claims, 7 Drawing Sheets

VD PROCESS AND APPARATUS FOR PRODUCING STAND-ALONE THIN FILMS

The present invention is a division of serial No. 09/062,723 filed April 14, 1998, now abandoned, which is number 07/991,502 filed Dec. 16, 1992, U.S. Pat. No. 5,252,366, issued Oct. 12, 1993 which is a division of serial number 07/469,128 filed Jan. 24, 1990, U.S. Pat. No. 5,129,360, issued Jul. 14, 1992.

STATEMENT OF GOVERNMENT INTEREST

The invention described herein may be manufactured and used by or for the Government for governmental purposes without the payment of any royalty thereon.

BACKGROUND OF THE INVENTION

The present invention relates to thin film deposition, and, in particular, relates to an apparatus and method of making stand-alone thin films.

Most of the single crystal semiconductor wafers produced to date, including silicon and gallium arsenide, have been manufactured by crystal growth techniques that rely on melting of the material. In the Czochralski technique, for example, the purified semiconductor material is first melted in a suitable vessel. Next, a seed crystal is dipped down into the melt and slowly withdrawn. If everything is done right, a long cylinder, called a boule, of the single crystal material is obtained. The boule is sliced up into many thin wafers which are then polished to get the wafers into a usable form for device manufacturing.

An alternative method of growing thin crystalline wafers of a material is to grow the layers by chemical vapor deposition (CVD) onto a single crystal substrate of a different, but readily available material. The process is called heteroepitaxy. Heteroepitaxy takes advantage of the fact that certain single crystal wafers, for example, silicon, are commercially available in large diameters. However, this technique has one major problem that is related to the high temperature (500–1200° C.) required for the CVD process. When the thin film-substrate is cooled down to room temperature after the growth is complete, the difference in the thermal expansion coefficients of the two different materials causes the film-substrate to bow and crack. U.S. Pat. No. 4,368,098, disclosed the deposition of material by the CVD process and is incorporated by reference.

One method of trying to prevent this bowing and cracking has been to grow a buffer layer between the film and the substrate. The paper by R. M. Lum, et al., Appl. Phys. Lett., 51, 36(1987), describes a method for growing gallium arsenide on silicon. It relies on growing a thin semi-amorphous gallium arsenide layer at low temperatures (425° C.) followed by a thicker gallium arsenide layer grown at standard CVD temperatures (about 700° C.). This method is shown to improve the crystalline quality. However, this technique is not totally successful in removing all of the stress induced by the thermal expansion differences.

A second method described by S. Sakai, Appl. Phys. Lett., 51, 1069(1987) involves pre-stressing the substrate in the opposite direction of the thermal expansion difference induced stress. This is accomplished by placing a substrate on a graphite holder with a screw-like push rod pushing against the back of the substrate (See FIG. 2 of the above) until the substrate is bowed. The holder and substrate are then placed in the CVD hot zone, heated up to growth temperature and the film is then grown on the substrate. The holder and substrate are then cooled to room temperature and the substrate is removed. The technique has two main drawbacks. First, it would be difficult to design a reactor injection system that would grow uniformly thick films across the whole wafer. Second, the technique will only work with substrates that are not brittle and break when stressed

SUMMARY OF THE INVENTION

This invention, referred to as Vapor Deposition (VD) of Stand-alone Films, is a process and apparatus for producing single crystal, polycrystal or amorphous stand-alone films. The process has two steps: First, thin layers of the desired materials are deposited by VD onto a hot foreign single crystal substrate wafer held by a substrate holder. The second step is to chemically etch away the substrate while still being held by the substrate holder while the film-substrate is still hot. The etch is stopped as soon as all of the foreign substrate is consumed. This leaves just the thin film which is then cooled down to room temperature.

The substrate holder of the present invention has therein a pocket for the substrate. The bottom surface of this space has a plurality of channels for carrying an etching gas which is input by a central channel in the substrate holder.

The thin films can be deposited by any of the various VD methods. The standard CVD process relies on thermal decomposition of the reactants on the substrate to produce the thin film material. However, other types of variations of VD could be used in this invention as long as the process also involves heating the substrate during deposition. The heating during deposition is key because it is the cooling of the film-substrate from the deposition temperature that causes the materials to become stressed (due to the difference in the thermal expansion coefficients). For example, plasma assisted CVD and D.C. or RF sputtering are commonly used to produce crystalline and/or polycrystalline thin films. Other VD processes such as Molecular Beam Epitaxy (MBE) could in principle, be used. The only limitation on the VD method that is used is that the process system hardware must be able to handle the hot etching gases and byproducts without corrosion induced problems. Thus, MBE could be used to vapor deposit the films but because it is an ultra-high vacuum system, it would cause more problems than it is worth. The typical CVD system hardware on the other hand is made to handle corrosive materials. Therefore, the preferred implementation that is described in the following paragraphs will be a CVD system that has a cooled reactant injector system such as in U.S. Pat. No. 5,129,360.

This invention is a process for growing free standing thin (<0.025") crystalline or amorphous large diameter (2"–10") wafers without the bowing and/or cracking. Silicon and gallium arsenide wafers used in the semiconductor industry are examples of commercially available substrates that would be usable by this invention.

Therefore, one object of the present invention is to provide a process for producing a stand-alone thin film.

Another object of the present invention is to provide a substrate holder for use in a VD apparatus having therein an actively cooled effusion device.

Another object of the present invention is to provide a process for the deposition of a thin film on a substrate and the removal of that substrate to leave the thin film.

Another object of the present invention is to provide a process for producing stand-alone thin films without any stress defects therein.

Another object of the present invention is to provide a process for the removal of a deposited thin film from a substrate at or about the deposition temperature.

These objects and many other objects and advantages of the present invention will be readily apparent to one skilled in the pertinent art from the following detailed description of a preferred embodiment of the invention and the related drawings.

DETAILED DESCRIPTION OF THE PREFERRED EMBODIMENT

Figure 1:
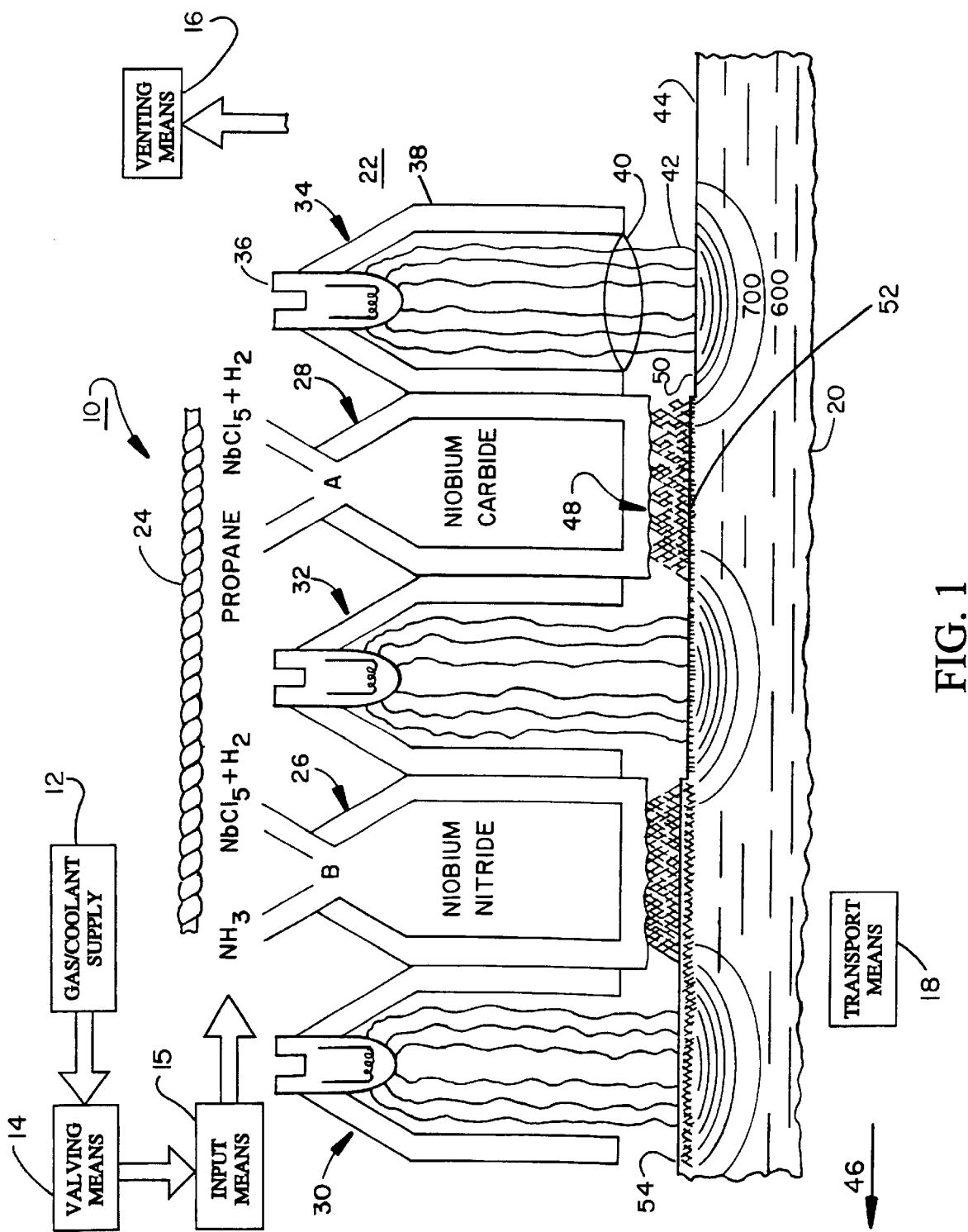
FIG. 1 illustrates a CVD reactor having a plurality of effusers with heating lamps.

Referring to FIG. 1, a chemical vapor deposition (CVD) reactor 10 is partially shown. The CVD reactor 10 includes a gas/coolant supply 12, valving means 14, input means 15, venting means 16, and transporting means 18 having at least one substrate 20 thereon. A reaction chamber 22 being enclosed by a metal wall 24, shown partially, has therein two actively cooled effusers 26 and 28 with heating means 30, 32 and 34 for depositing on the substrate 20 a lay of niobium carbide followed by a layer of niobium nitride. Other types and numbers of layers are clearly possible as well as the number of heating means and effusers. The substrate 20 is moving to the left as is indicated by arrow 46. This embodiment is only considered to be illustrative of the apparatus and the technique involved.

As the substrate 20 is transported to the left, heating means 34 being a heating lamp 36 in a housing 38 with an optional focusing means 40 causes light energy 42 to fall upon the substrate 20 and heat it to a required reaction temperature at a surface 44 of the substrate 20. First reactants 48 are emitted from the actively cooled effuser 28 onto the heated surface 50. Since the reactants are deposited only on the surface, heating is only selectively required at this location and only to a depth of about 5 microns or so. The actively cooled effuser is positioned within about a few millimeters of the surface 44 thus reducing recirculation of spent gases and pre-reaction of the gases.

The subsequent heating means 32 and the actively cooled effuser 26 deposit a second layer 54 on a first layer 52.

The reactants supplied by the gas supply 12 are directed through the valving means 14 to the appropriate actively cooled effuser. The venting means 16 removes the spent reactants from the reaction chamber 22.

The transporting means 18 may be either a rotary table or a linearly moving table with either single or multiple substrates thereon. Further, the transporting means 18 may alternatively move the actively cooled effusers and heating means.

Figure 2:
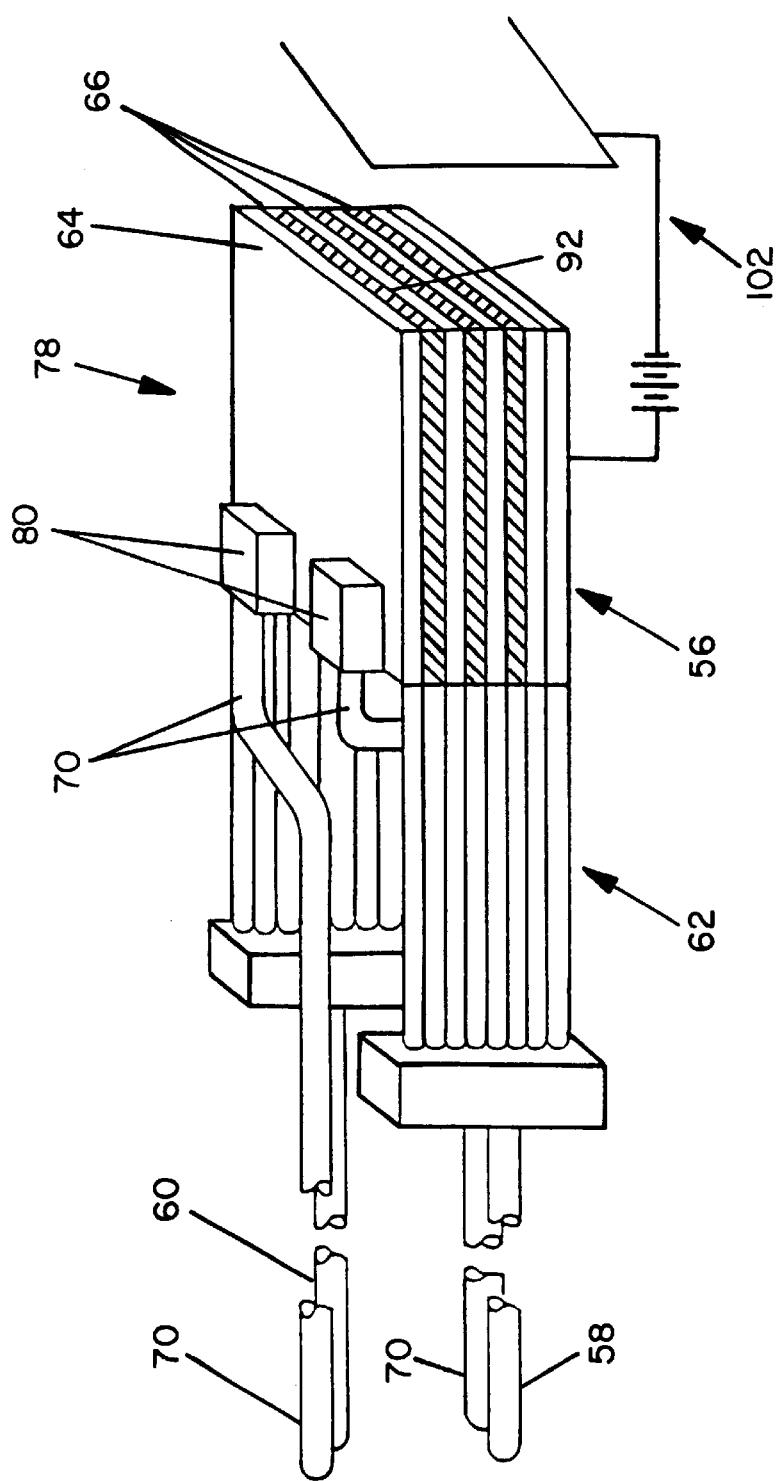
FIG. 2 illustrates by view a single actively cooled effuser.

Referring to FIG. 2, a single actively cooled effuser 56 is shown.

The Effuser 56 has a coolant input 58 and a coolant output 60 feeding into and out of a coolant manifold 62. The coolant manifold 62 is further connected to a number of cooling plates 64, FIG. 4, which are interleaved with gas directing plates 66, FIG. 3A or 3D. If multiple gas directing plates 66 are grouped between coolant plates 64, isolation plates 68, FIG. 3B, may be used to separate these.

As to the gas directing plates 66 and the isolation plates 68 reference is made to U.S. Pat. No. 4,736,705 which is incorporated by reference.

Figure 3:
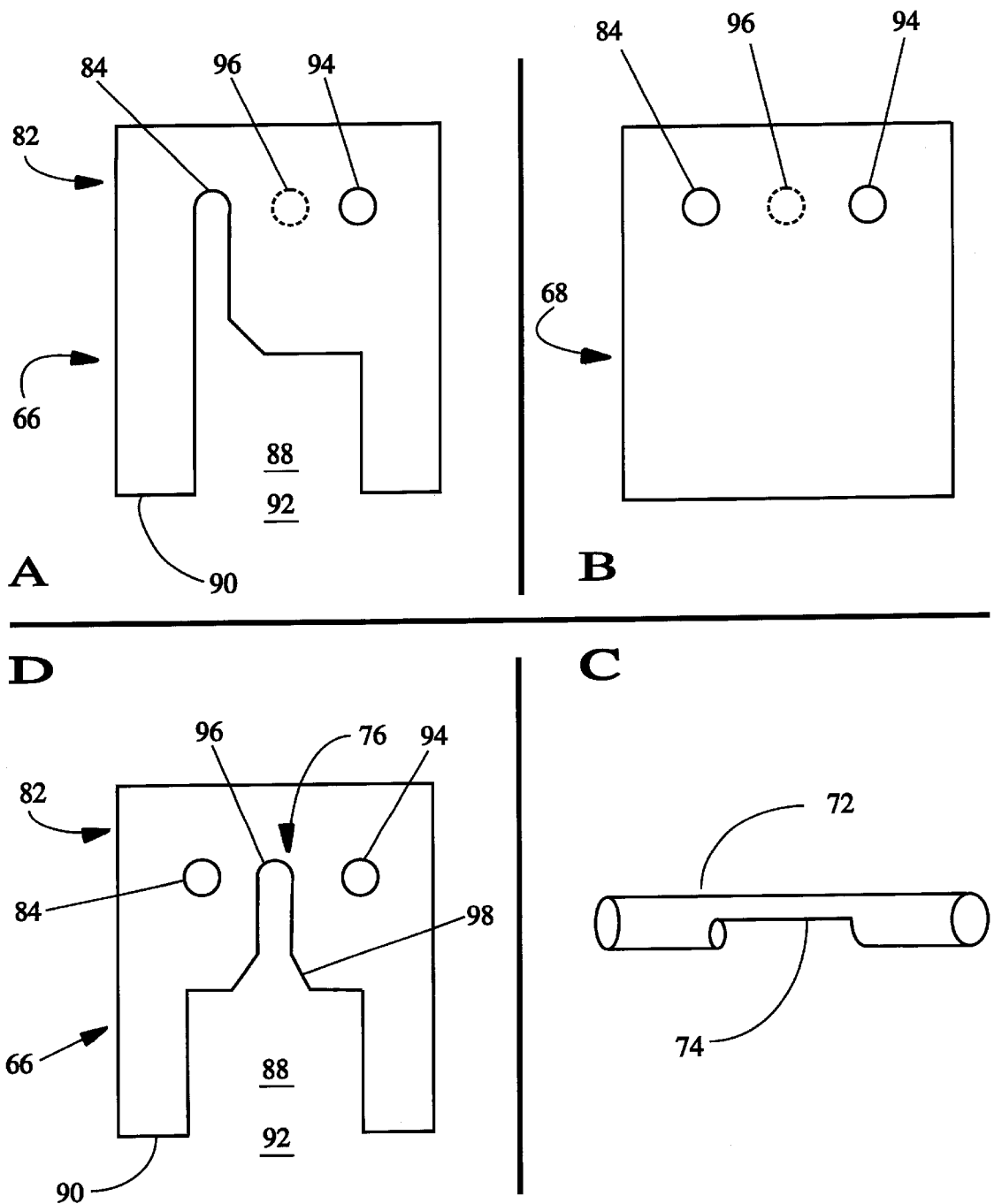
FIG. 3A illustrates by side view a single gas directing plate.
FIG. 3B illustrates by side view an isolation plate.
FIG. 3C illustrates a slotted feed rod.
FIG. 3D illustrates a gas directing plate with a center feed.

Referring back to FIG. 2, gas inputs 70 are connected to a pair of slotted feed rods 72, such as shown in FIG. 3C, having a longitudinal slot 74 therein. As the gas flows into rod 72, it exits through the slot 74 in accordance to the positioning of the gas directing plates 66.

Referring to FIG. 3A, the gas directing plate 66 shown has two gas inputs. The dotted lines indicate the structure when a third gas input 76, FIG. 3D, is included. A third rod 72 is inserted into the hole 96.

In order to assemble plate stack 78, FIG. 2, two slotted feed rods 72 are inserted into coupling blocks 80. The coupling blocks 80 are attached to the cooling plate 64. Nextly, the gas directing plate 66 is placed over the rods 72 and next to the cooling plate 64. Then another cooling plate 64 is placed on rods 72 and next to the gas directing plate 66.

Again referring to FIG. 3A, the gas directing plate 66 shown is considered a "left rod plate" 82 since the rod 72 passes through a hole 84 with a flow channel 86 fluidly connected thereto and flow channel 86 is fluidly connected to a gas directing section 88. As the gas flows into rod 72 it exits through the slot 74 into the flow channel 86 and then into the gas directing section 88 from there exiting through an output side 90 having an orifice 92 therein. The gas flowing in the right rod 72 through hole 94 is not able to enter gas directing section 88 because there is no flow channel at the section.

In order for the gas to exit from the right rod, gas directing plate 66 is flipped over when it is attached to the plate stack 78 to form a "right rod plate." Each gas directing plate 66 has either the cooling plate 64 and/or the isolation plate 68 on each side while in the plate stack 78.

A third feed rod 72 may be placed in a third hole 96, FIG. 3D. In order for the gas to flow from the third rod 72 only, only the center flow channel 98 can exist in that plate as shown.

As noted above each gas directing plate 66 has either the isolation plate 68 and/or the cooling plate 64 on both sides unless there is a desire to either pre-mix or pre-react the gases.

Figure 4:
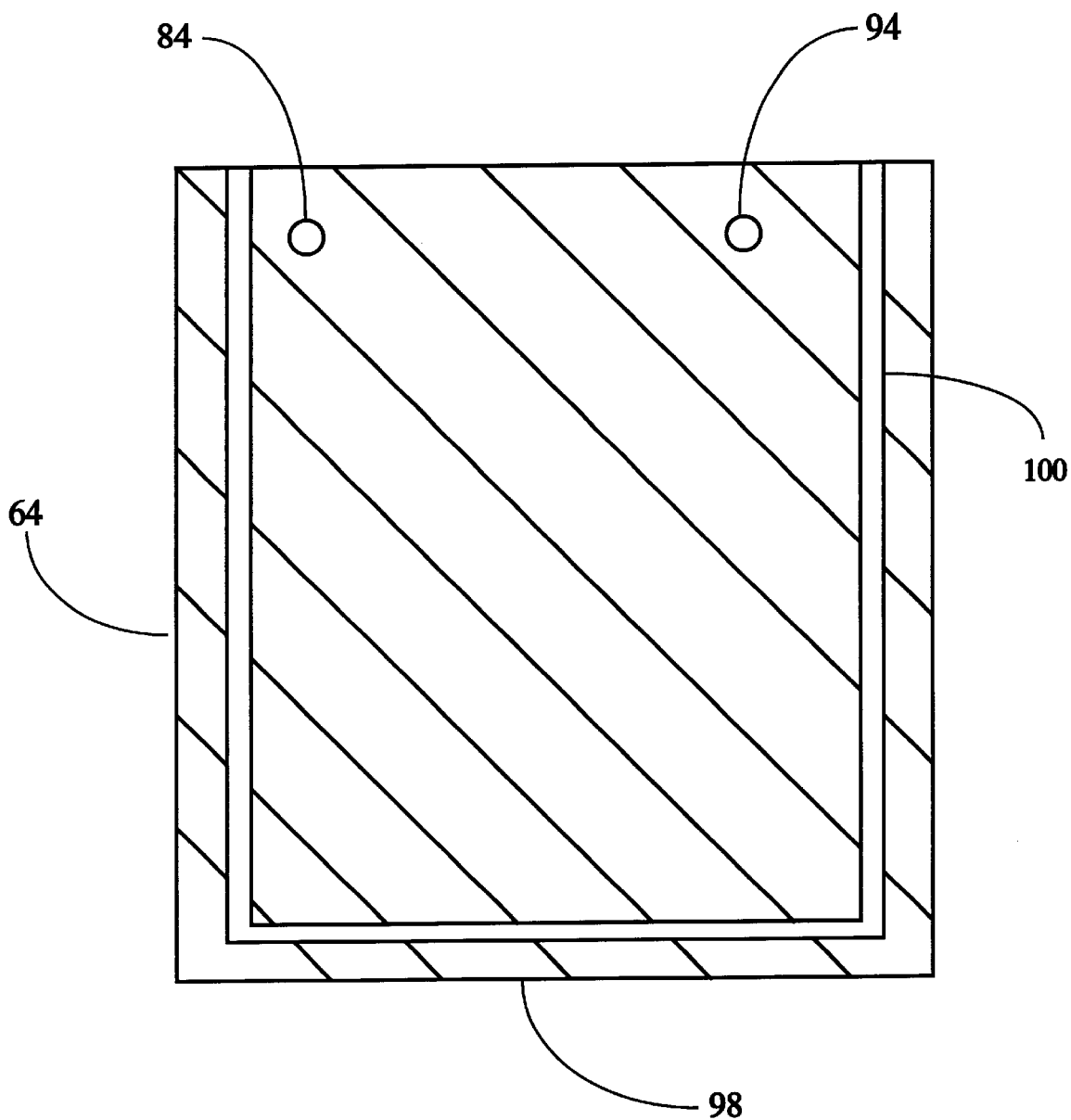
FIG. 4 illustrates by a cross section view a cooling plate.

The cooling plate 64 is shown in detail in FIG. 4. The holes 84 and 94 for the rods 72 pass directly through. A flow channel 100 connected to the coolant manifold 62 passes within a few thousandths of an inch to a cooling side 98. Even when the substrate surface 50 is within a distance of about 0.010 to 0.1 inches, the output side 90 of gas directing plates 66 should remain cool when the surface 50 is at about 800 degrees Centigrade. Reflecting material may be applied to the cooling side 98 to reduce the heating affect.

Another feature of the invention is a plasma producing means 102 shown in FIG. 2 wherein an DC or AC voltage is applied between plate stack 78 and the substrate 20. The close proximity of the plate stack 78 to the substrate 20 allows for modest voltages to create the required electric field to induce the plasma state.

The actively cooled effusion cell is applied to a process of producing stand-alone thin films where the actively cooled effussion cell deposits the material on a substrate in a substrate holder.

Figure 5:
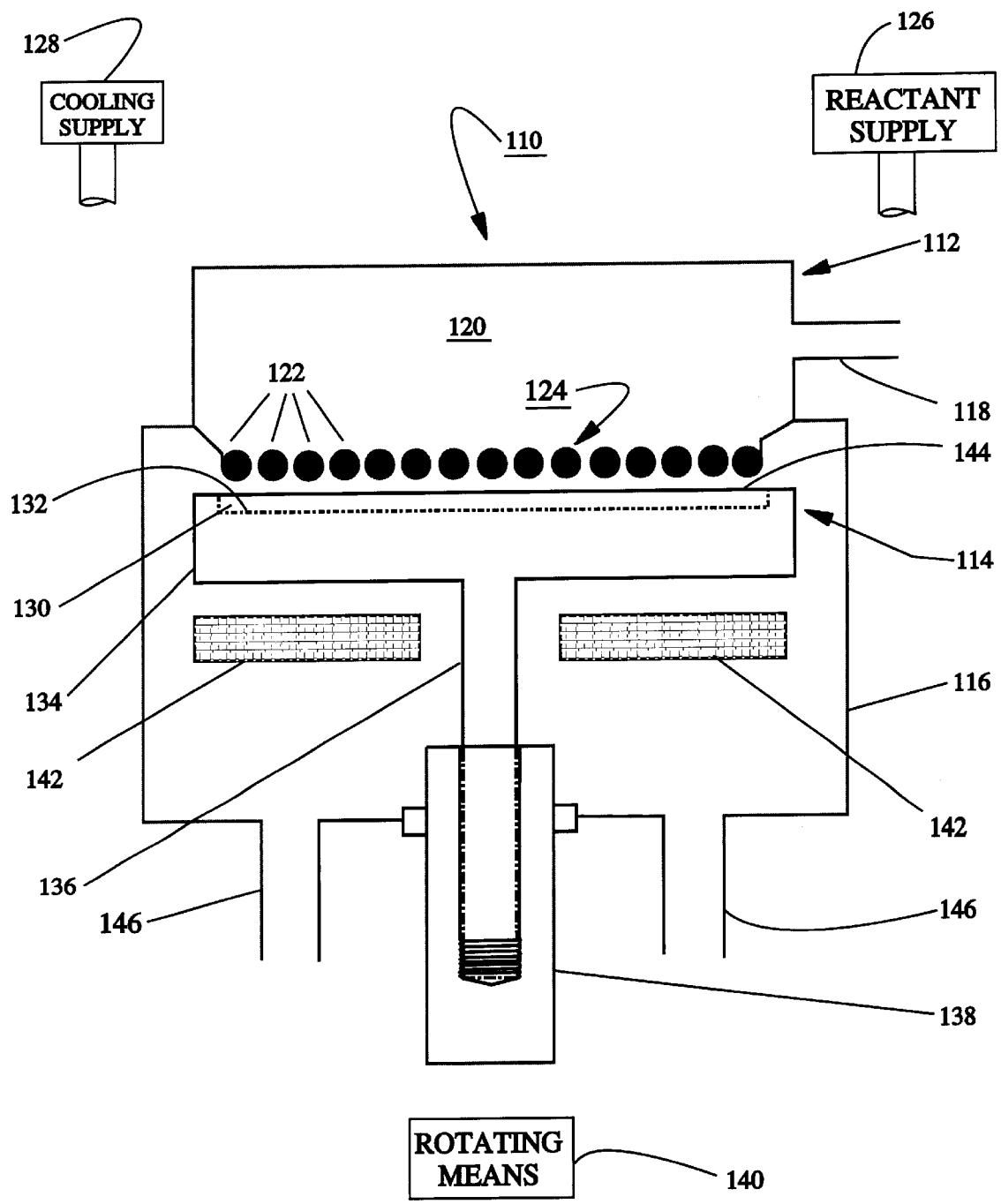
FIG. 5 illustrates by side view cross section a VD reactor having therein a cooled shower-head injector.

Referring to FIG. 5, a vapor deposition (VD) reactor 110 is shown having an actively cooled effusion apparatus 112 positioned over a substrate platter 114 within a chamber 116.

In this embodiment, a single reactant from a reactant supply 126 enters through an input 118 and flows into a plenum 120. At the bottom of the plenum 120 are a plurality of parallel cooling tubes 122 forming a cooling manifold 124 receiving a cooling fluid from a cooling supply 128. The cooling tubes 122 are spaced apart to allow the passage of the reactant gas. Since there is a single reactant which must cover a substrate 130, the plurality of parallel, spaced apart, cooling tubes 122 effectively act, from the substrate position, as a multiple of the gas directing plates 66 with the cooling therein. The substrate 130 sits within a substrate pocket 132 milled within the substrate platter 134 to a depth which is approximately the thickness of the substrate 144. The substrate platter 144 is made of graphite or molydenum. The substrate platter 134 has a support 136 which is connected to a feedthrough 138 that is rotatably sealed in the chamber 116. A motor and controls 140 for rotating are connected to the feedthrough 138. The substrate platter feedthrough 138 is made out of a low thermal conducting metal such as stainless steel so that the heat from the substrate platter 134 does not overheat the vacuum seal, not shown. The substrate platter 134 is attached to the feedthrough 138 by threaded attachment on the support 138 in FIG. 5. Below the substrate platter 134 is a platter heater 142 which heats the substrate 130 to a high temperature of about 500 to 1000° C. After the reactants pass the substrate 130 they flow out of the chamber 116 through exhaust ports 146. This heater may be a resister heater, an RF heater, etc.

Figure 6:
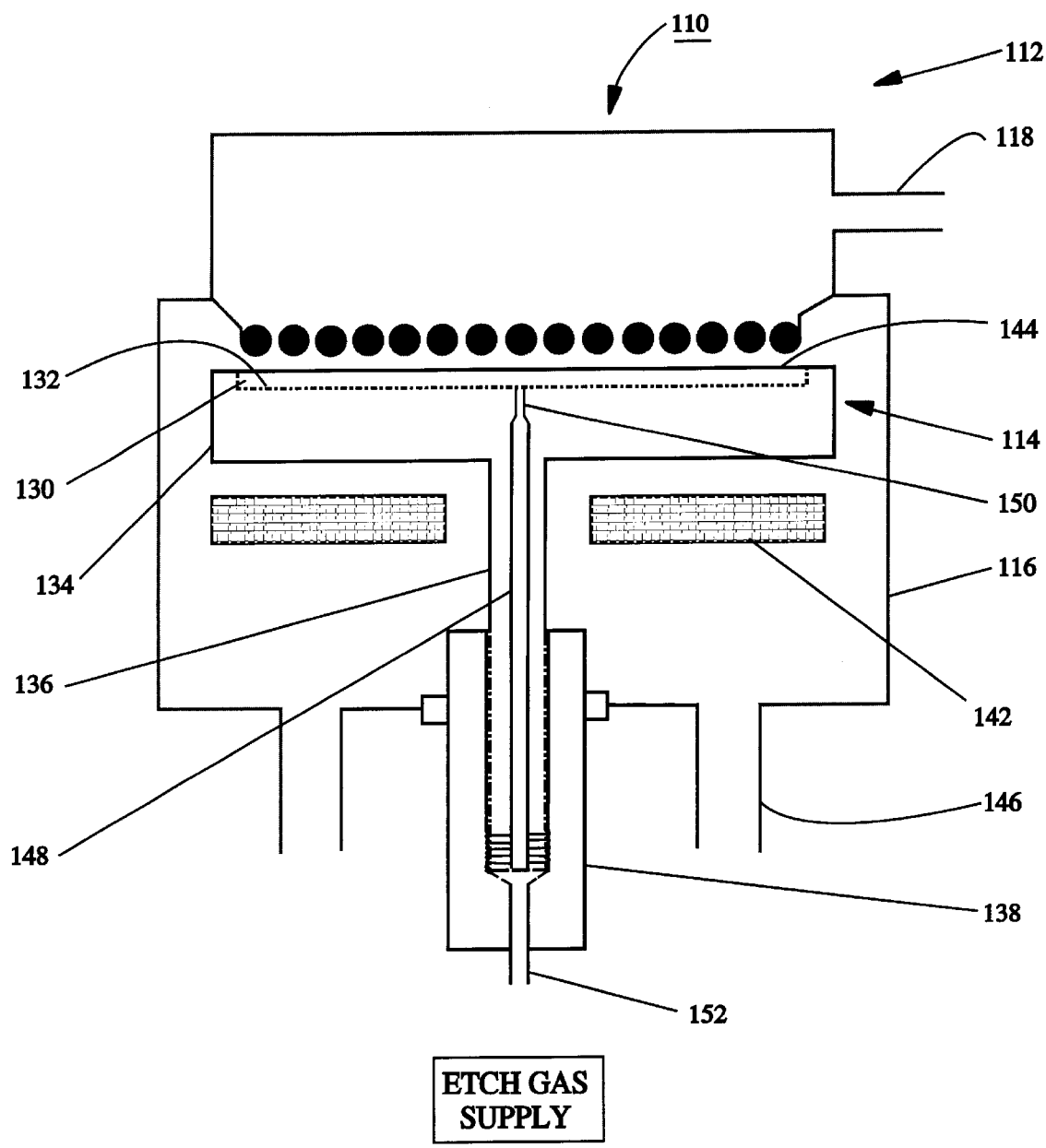
FIG. 6 illustrates by side view cross section a VD reactor having therein a cooled shower-head injector with a substrate holder with etching gas channels therein.

Referring to FIG. 6, the substrate platter 134 has a central channel 148 which enters into the pocket 132 at the bottom of such. A last section 150 of the channel 148 is of a small diameter such as 1/16 of an inch to prevent temperature variations on the substrate 130. An etching gas enters a port 152 in the feedthrough 138 and flows up the channel 148.

Figure 7:
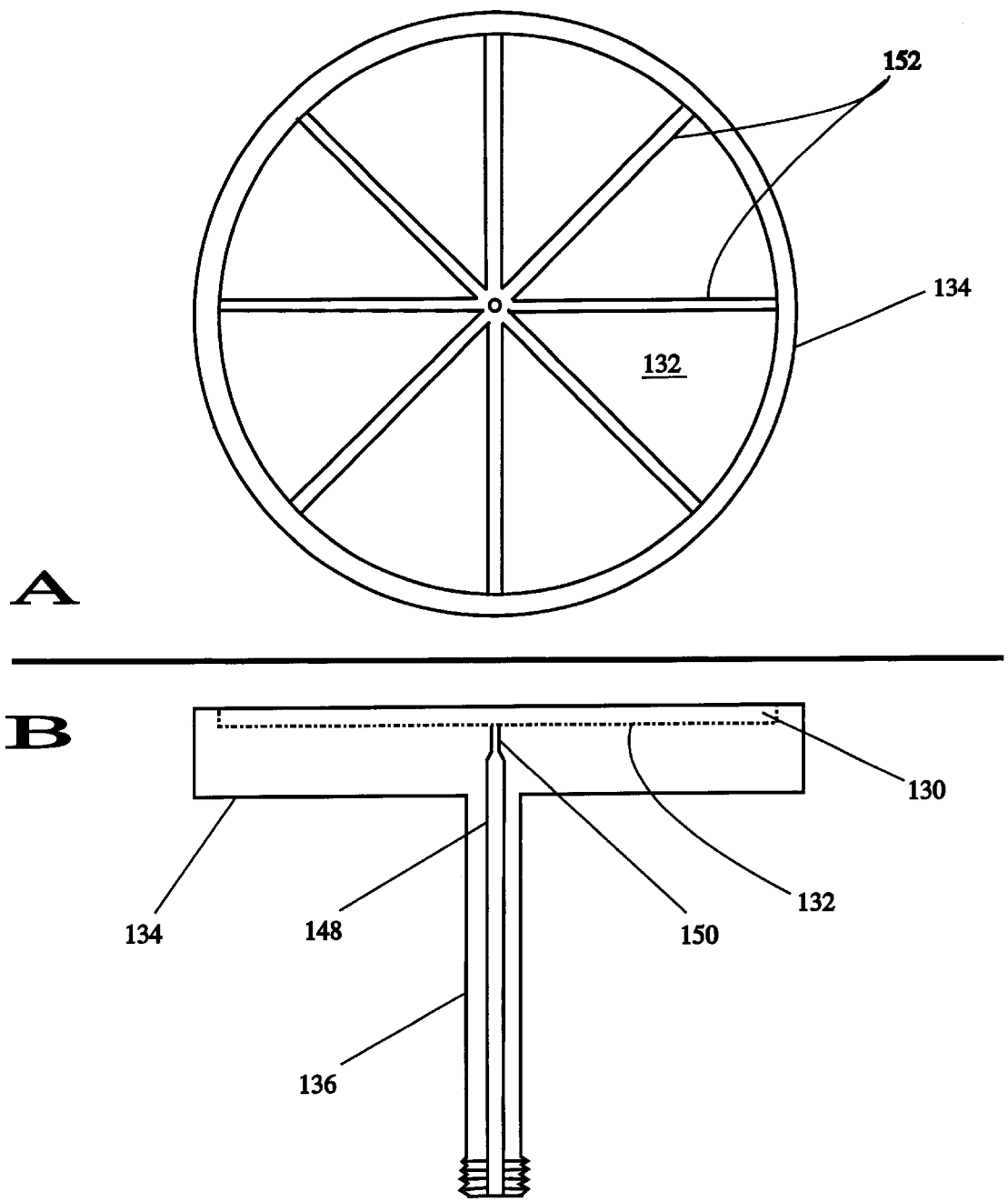
FIGS. 7A and 7B illustrate by top view and side view the substrate holder with the etching gas channels therein.

Referring to FIGS. 7A and 7B, a plurality of flow channels 152 being very shallow, approximately 0.005 inches, are milled in the bottom of the pocket 132 and radiate from the channel 148. Other patterns are clearly possible such as spirals, etc. but the primary function is to spread the etchant gas-under the substrate 130 uniformly.

In the process of the present invention a single crystal, polycrystal or amorphous films, are deposited by VD onto a foreign single crystal substrate 130 wafer in the manner described in U.S. Pat. No. 5,129,360. Prior to cooling down to room temperature, the substrate material is then removed by introducing the gas etch at the film's growth temperature. When the substrate 130 is completely consumed (which can be determined by monitoring the exhaust gas stream), the etch gas flow is turned off and the stand-alone film is cooled down to room temperature. The etch gas should be selected so that it only etches the substrate. If this is not possible, the exhaust gas stream can be monitored to detect when the substrates byproducts stop appearing and when the film's etched byproducts start to appear. The etch gas flow would then be turned off. The stand-alone film would then be cooled down to room temperature.

Clearly, many modifications and variations of the present invention are possible in light of the above teachings and it is therefore understood, that within the inventive scope of the inventive concept, the invention may be practiced otherwise than specifically claimed.

What is claimed is:

1. A process for producing a stand-alone film, said process comprising the steps of:

depositing a thin film by vapor deposition in a reactor chamber, said thin film being deposited on a substrate, said substrate being held within a pocket of a substrate platter, said substrate being heated to a temperature at which said depositing occurs;

inputting an etch gas into said reactor, said etch gas flowing through said substrate platter and under said substrate held within said pocket, allowing said etch gas to remove said substrate to leave said thin film;

cooling said thin film from said temperature at which said depositing occurs; and removing said thin film, said thin film being a stand-alone thin film.

2. A process for producing a stand-alone thin film as defined in claim 1 further including rotating said substrate platter during said depositing.

3. A process for producing a stand-alone film, said process comprising the steps of:

depositing a thin film by vapor deposition in a reactor chamber, said thin film being deposited on a substrate, said substrate being held within a pocket of a substrate platter, said substrate being heated to a temperature at which said depositing occurs;

inputting an etch gas into said reactor, said etch gas flowing through said substrate platter and under said substrate held within said pocket, allowing said etch gas to remove said substrate to leave said thin film;

cooling said thin film from said temperature at which said depositing occurs; and removing said thin film, said thin film being a stand-alone thin film.

4. A process for producing a stand-alone thin film as defined in claim 3 further including rotating said substrate platter during said depositing.

5. A process for producing a stand-alone film, said process comprising the steps of:

placing a substrate in a substrate holder within a reactor chamber, said substrate being selected for forming a thin film thereupon;

heating said substrate to a predetermined temperature;

depositing a thin film by vapor deposition in said reactor chamber upon said substrate, said heating being to said predetermined temperature at which said depositing occurs;

inputting an etch gas into said reactor chamber, said etch gas flowing through said substrate holder and under said substrate, allowing said etch gas to remove said substrate to leave said thin film;

determining when said substrate is removed from said thin film;

cooling said thin film from said temperature at which said depositing occurs; and removing said thin film, said thin film being a stand-alone thin film.

6. A process as defined in claim 3 wherein said substrate is a foreign single crystal material.

7. A process as defined in claim 4 wherein said substrate is selected from a group consisting of silicon, SiC, GaP, Ge and GaAs.

8. A process as defined in claim 3 wherein said thin film is composed on a III–V material.

9. A process as defined in claim 6 wherein said thin film is a single crystal, polycrystal or amorphous.

10. A process as defined in claim 3 wherein at least one buffer layer is deposited first upon said substrate.

11. A process as defined in claim 3 wherein said depositing is of a plurality of layers to form said thin film of a predetermined thickness.

12. A process as defined in claim 3 wherein said stand-alone thin film has a thickness of less than about 0.025 inches and a diameter from about 2 to about 10 inches.

* * * * *